(12) United States Patent
Tsai et al.

(10) Patent No.: US 8,836,049 B2
(45) Date of Patent: Sep. 16, 2014

(54) SEMICONDUCTOR STRUCTURE AND PROCESS THEREOF

(75) Inventors: Min-Chuan Tsai, New Taipei (TW); Hsin-Fu Huang, Tainan (TW); Chi-Mao Hsu, Tainan (TW); Chin-Fu Lin, Tainan (TW); Chien-Hao Chen, Yun-Lin County (TW); Wei-Yu Chen, Tainan (TW); Chi-Yuan Sun, Yunlin County (TW); Ya-Hsueh Hsieh, Kaohsiung (TW); Tsun-Min Cheng, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/495,009

(22) Filed: Jun. 13, 2012

(65) Prior Publication Data
US 2013/0334690 A1 Dec. 19, 2013

(51) Int. Cl.
*H01L 29/94* (2006.01)
*H01L 29/76* (2006.01)

(52) U.S. Cl.
USPC .............. 257/412; 257/E29.16; 257/E21.179; 438/592; 438/590

(58) Field of Classification Search
USPC .................... 257/412, 751, E29.16, E21.179; 438/592, 590
See application file for complete search history.

(56) References Cited

U.S. PATENT DOCUMENTS

| | | |
|---|---|---|
| 5,892,282 A | 4/1999 | Hong |
| 6,077,772 A * | 6/2000 | Park et al. ..................... 438/627 |
| 6,096,659 A | 8/2000 | Gardner |
| 6,177,303 B1 | 1/2001 | Schmitz |
| 6,303,418 B1 | 10/2001 | Cha |
| 6,458,684 B1 | 10/2002 | Guo |
| 6,573,134 B2 | 6/2003 | Ma |
| 6,960,416 B2 | 11/2005 | Mui |
| 7,126,199 B2 | 10/2006 | Doczy |
| 7,144,783 B2 | 12/2006 | Datta |
| 7,148,548 B2 | 12/2006 | Doczy |
| 7,153,784 B2 | 12/2006 | Brask |
| 7,176,090 B2 | 2/2007 | Brask |
| 7,186,605 B2 | 3/2007 | Cheng |
| 7,208,361 B2 | 4/2007 | Shah |
| 7,217,611 B2 | 5/2007 | Kavalieros |
| 7,355,281 B2 | 4/2008 | Brask |
| 7,407,876 B2 | 8/2008 | Ishizaka |
| 7,556,998 B2 | 7/2009 | Park |
| 7,700,479 B2 | 4/2010 | Huang |
| 7,871,915 B2 * | 1/2011 | Lim et al. ..................... 438/592 |
| 7,923,321 B2 | 4/2011 | Lai |
| 2006/0024953 A1 | 2/2006 | Papa Rao |
| 2006/0079005 A1 * | 4/2006 | Brask et al. ..................... 438/3 |
| 2007/0132003 A1 * | 6/2007 | Takashima et al. ........... 257/315 |
| 2007/0145591 A1 | 6/2007 | Yano |

(Continued)

OTHER PUBLICATIONS

Huang et al., Title: Metal Gate and Fabrication Method Thereof, pending U.S. Appl. No. 13/161,519, filed Jun. 16, 2011.

*Primary Examiner* — Tu-Tu Ho
(74) *Attorney, Agent, or Firm* — Winston Hsu; Scott Margo

(57) ABSTRACT

A semiconductor structure includes a work function metal layer, a (work function) metal oxide layer and a main electrode. The work function metal layer is located on a substrate. The (work function) metal oxide layer is located on the work function metal layer. The main electrode is located on the (work function) metal oxide layer. Moreover a semiconductor process forming said semiconductor structure is also provided.

12 Claims, 5 Drawing Sheets

(56) References Cited

U.S. PATENT DOCUMENTS

| | | |
|---|---|---|
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2009/0057769 A1 | 3/2009 | Wei |
| 2009/0186458 A1 | 7/2009 | Yu |
| 2010/0044783 A1 | 2/2010 | Chuang |
| 2010/0065926 A1 | 3/2010 | Yeh |
| 2010/0068877 A1 | 3/2010 | Yeh |
| 2010/0081262 A1* | 4/2010 | Lim et al. .................. 438/479 |
| 2010/0087055 A1 | 4/2010 | Lai |
| 2010/0124818 A1 | 5/2010 | Lee |
| 2010/0216287 A1* | 8/2010 | Tsai et al. .................. 438/199 |
| 2010/0244141 A1 | 9/2010 | Beyer |
| 2012/0001262 A1* | 1/2012 | Kang et al. .................. 257/368 |
| 2012/0319179 A1 | 12/2012 | Huang |
| 2012/0322246 A1* | 12/2012 | Wang et al. .................. 438/488 |

* cited by examiner

SEMICONDUCTOR STRUCTURE AND PROCESS THEREOF

BACKGROUND OF THE INVENTION

1. Field of the Invention

The present invention relates generally to a semiconductor structure and a process thereof, and more specifically to a semiconductor structure and a process thereof that forms a metal oxide layer on a work function metal layer.

2. Description of the Prior Art

Poly-silicon is conventionally used as a gate electrode in semiconductor devices such as metal-oxide-semiconductors (MOS). But with the trend towards scaling down the size of semiconductor devices, conventional poly-silicon gates face problems such as lower performances due to boron penetration and unavoidable depletion effect. This increases the equivalent thickness of the gate dielectric layer, reduces the gate capacitance, and worsens the driving force of the devices. Therefore, work function metals that are suitable to be used as high-K gate dielectric layers are employed to replace the conventional poly-silicon gate to be the control electrode.

Generally, methods of forming a metal gate by replacing a conventional polysilicon gate with a work function metal include: a sacrificial gate is formed on a substrate; a spacer is formed on the substrate beside the sacrificial gate; a source/drain region is formed and automatically aligned by using the spacer; an interdielectric layer is disposed and planarized on the substrate; the sacrificial gate is removed to form a recess, and then a work function metal layer, a barrier layer and aluminum are sequentially filled into the recess to form a metal gate.

As sizes of semiconductor components are reduced, material layers such as a barrier layer having large enough thicknesses to prevent the aluminum from diffusing downwards would be filled into the recess after the work function metal layer is filled. Thus, part of the volume of the recess and the opening size of the recess are occupied, so that difficulties for filling the recess with aluminum occur. Furthermore, as the sizes of the semiconductor components are reduced, the volume and the exposing surface area of aluminum shrink, the contact resistance between the aluminum and a contact plug formed above increases. As the semiconductor components are formed precisely, the electrical demand is more critical. How to improve the work function values of the semiconductor components becomes an important issue.

SUMMARY OF THE INVENTION

The present invention provides a semiconductor structure and process thereof, which forms a metal oxide layer on a work function metal layer to solve said problems.

The present invention provides a semiconductor structure including a work function metal layer, a work function metal oxide layer and a main electrode. The work function metal layer is located on a substrate. The work function metal oxide layer is located on the work function metal layer. The main electrode is located on the work function metal oxide layer.

The present invention provides a semiconductor structure including a work function metal layer, a metal oxide layer and a main electrode. The work function metal layer is located on a substrate. The metal oxide layer is located on the work function metal layer. The main electrode is located on the metal oxide layer.

The present invention provides a semiconductor process including the following steps. A work function metal layer is formed on a substrate. A metal oxide layer is formed on the work function metal layer. A main electrode is formed on the metal oxide layer.

According to the above, the present invention provides a semiconductor structure and a process thereof, which forms a metal oxide layer on a work function metal layer. This way, difficulties for filling recesses, reduction of contact resistance between a contact plug and aluminum, and fine tuning the work function values of metal gates can be improved, thereby enhancing the performances of formed semiconductor components.

These and other objectives of the present invention will no doubt become obvious to those of ordinary skill in the art after reading the following detailed description of the preferred embodiment that is illustrated in the various figures and drawings.

DETAILED DESCRIPTION

The semiconductor process of the present invention can be applied to a gate-last for high-k first process or a gate-last for high-k last process etc, and is suitable for being applied in a single MOS transistor, a CMOS transistor or etc. Furthermore, a planar MOS transistor having a metal gate is used as an example in the following, but the present invention can also be applied to a fin-shaped field effect transistor (FinFET) or a tri-gate MOSFET etc having metal gate. To clarify the present invention, a planar MOS transistor applying a gate-last for high-k first process is presented below, but it is not limited thereto.

Figure 1:
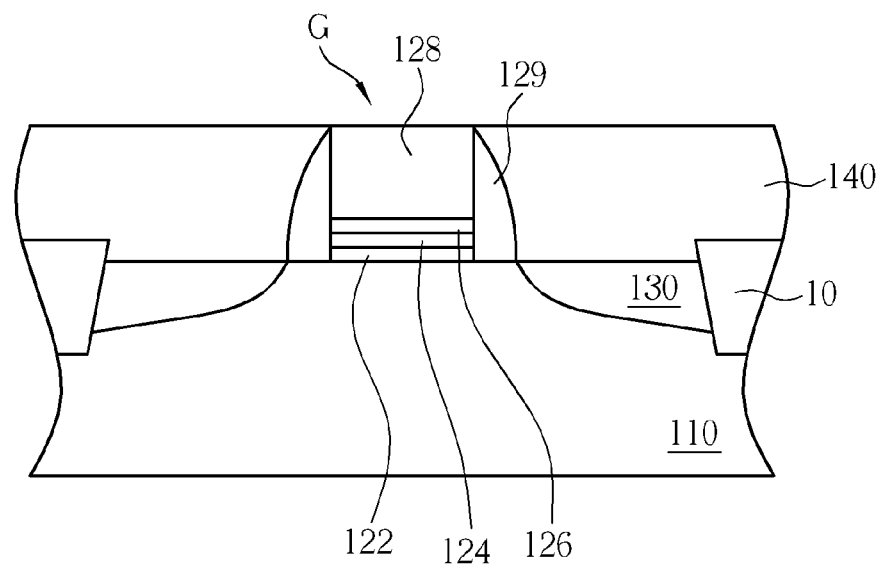
FIGS. 1-8 schematically depict cross-sectional views of a semiconductor process according to an embodiment of the present invention.

FIGS. 1-8 schematically depict cross-sectional views of a semiconductor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 is formed in the substrate 110 to electrically isolate each transistor. The isolation structure 10 may be a shallow trench isolation (STI) structure, formed by a shallow trench isolation process, but it is not limited thereto. The method of forming the isolation structure is known in the art, and will therefore not be described herein.

A buffer layer (not shown), a gate dielectric layer (not shown), a barrier layer (not shown) and a sacrificial electrode layer (not shown) are sequentially formed from bottom to top to cover the substrate 110; the sacrificial electrode layer (not shown), the barrier layer (not shown), the gate dielectric layer (not shown) and the buffer layer (not shown) are patterned to form a buffer layer 122, a gate dielectric layer 124, a barrier layer 126 and a sacrificial electrode layer 128 on the substrate 110. A sacrificial gate G including the buffer layer 122, the gate dielectric layer 124, the barrier layer 126 and the sacrificial electrode layer 128 is now formed. In another embodiment, a cap layer (not shown) may be selectively formed on the top of the sacrificial gate G to be used as a hard mask for patterning.

The buffer layer 122 maybe an oxide layer, formed by a thermal oxidation process, a chemical oxidation process, etc. The buffer layer 122 is located between the gate dielectric layer 124 and the substrate 110 to buffer the gate dielectric layer 124 and the substrate 110. A gate-last for high-k first process is applied in this embodiment, so that the gate dielectric layer 124 is a gate dielectric layer of a high dielectric constant, and may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST), but it is not limited thereto. In another embodiment, as a gate-last for high-k last process is applied, the gate dielectric layer 124 will be removed in later processes and then a gate dielectric layer of a high dielectric constant is filled, so that the gate dielectric layer 124 can be a sacrificial material easy to remove in later processes. The barrier layer 126 is located on the gate dielectric layer 124 to act as an etch stop layer while the sacrificial electrode layer 128 is removed to protect the gate dielectric layer 124, and for preventing metals above from diffusing downwards thereby polluting the gate dielectric layer 124. The barrier layer 126 may be a single layer structure or a multilayer structure composed of tantalum nitride (TaN), titanium nitride (TiN) or etc . The sacrificial electrode layer 128 maybe formed by polysilicon, but it is not limited thereto.

A spacer 129 is formed on the substrate 110 beside the sacrificial gate G. An ion implantation process is performed to automatically align and form a source/drain region 130 in the substrate 110. The spacer 129 may be a single layer structure or a multilayer structure composed of silicon nitride or silicon oxide etc. A salicide process may be selectively performed to form a metal silicide (not shown) on the source/drain region 130; a contact etch stop layer (CESL) may be selectively formed to cover the substrate 110. An interdielectric layer (not shown) is formed to cover the substrate 110 and the sacrificial gate G, and then the interdielectric layer (not shown) is planarized to form an interdielectric layer 140 and expose the sacrificial electrode layer 128.

Figure 2:
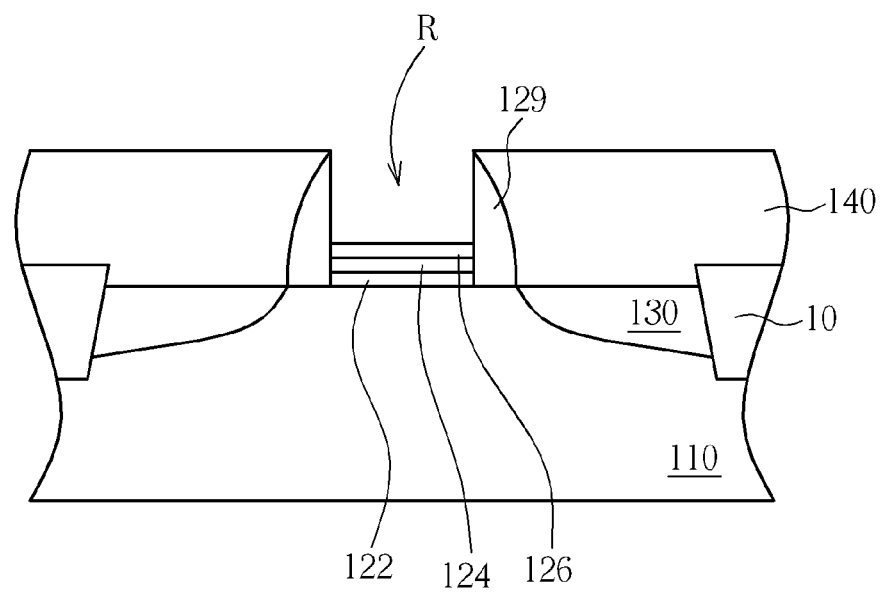
Figure 3:
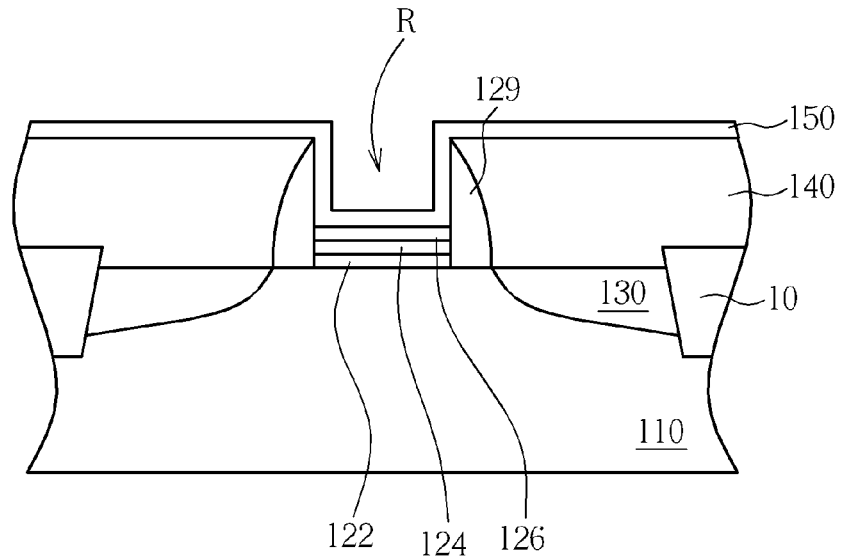

The sacrificial electrode layer 128 is removed by a method such as etching. As shown in FIG. 2, a recess R is formed and the barrier layer 126 is exposed. As shown in FIG. 3, a work function metal layer 150 is formed to fully cover the recess R and the interdielectric layer 140. In one case, the work function metal layer 150 may be a single layer or a multilayer structure, composed of titanium nitride (TiN), titanium carbide (TiC), tantalum nitride (TaN), tantalum carbide (TaC), tungsten carbide (WC), titanium aluminide (TiAl), aluminum titanium nitride (TiAlN) or etc. For example, the work function metal layer 150 may be a titanium nitride layer suited to form a PMOS transistor (the work function value is between the range of 4.8 eV and 5.2 eV). In this embodiment, the work function metal layer 150 is a titanium aluminide layer suited to form a NMOS transistor (the work function value is between the range of 3.9 eV and 4.3 eV).

Figure 4:
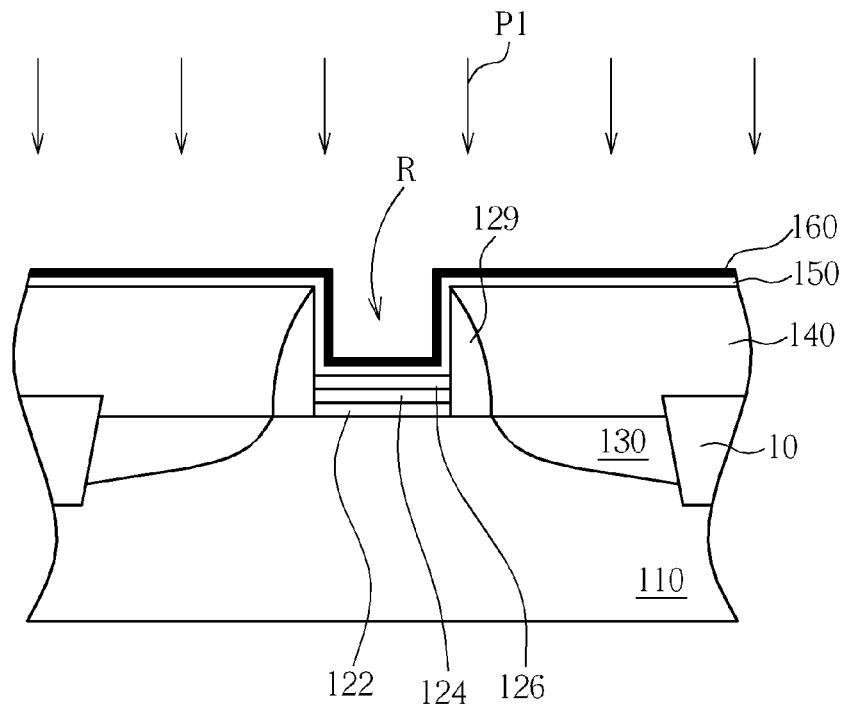

As shown in FIG. 4, a metal oxide layer 160 is formed on the work function metal layer 150 to prevent metals formed above in later processes from diffusing downward. In this embodiment, the metal oxide layer 160 is obtained by performing an oxidation process P1 to oxidize the surface of the work function metal layer 150, therefore the metal oxide layer 160 is a work function metal oxide layer of the work function metal layer 150, but it is not limited thereto. Specifically, the work function metal layer 150 may be deposited in a processing chamber, and then the work function metal layer 150 is exposed to the air, enabling the surface of the work function metal layer 150 to oxidize to form the metal oxide layer 160. In another embodiment, the metal oxide layer 160 may be obtained by importing oxygen, ozone or vapor, etc . . . , into the chamber, or the metal oxide layer 160 may be obtained by being exposed to an environment having these gases. The thickness of the metal oxide layer 160 can be controlled by the exposure time of the work function metal layer 150 to the air, the exposure time of the work function metal layer 150 to the environment having these gases or the concentration of these gases, or the time importing these gases or the concentration of these imported gases. Since the work function metal layer 150 is a titanium aluminide layer, the metal oxide layer 160 is an aluminum titanium oxide layer oxidized by the work function metal layer 150. The chemical formula of the aluminum titanium oxide layer includes $Ti_xAl_yO_z$, with x·y·z larger than zero, and the ratio of the x·y·z depends upon the concentration of the gases such as oxygen, ozone or vapor etc. In an embodiment, the chemical formula of the aluminum titanium oxide layer is TiAlO, but it is not limited thereto.

Figure 5:
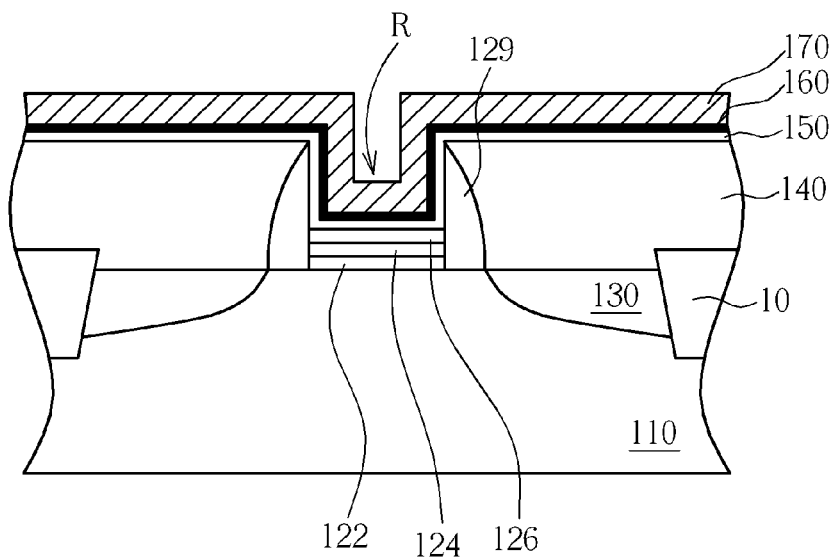
Figure 6:
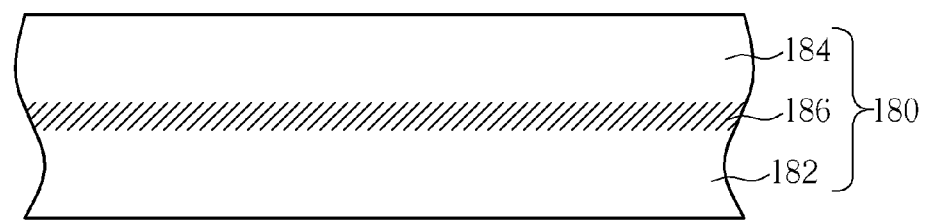

As shown in FIG. 5, a barrier-wetting layer 170 is formed on the metal oxide layer 160. The barrier-wetting layer 170 has the properties of a barrier layer and a wetting layer. That is, the barrier-wetting layer 170 can prevent metals above formed in later processes, such as aluminum, from diffusing downward and enhancing the attaching properties of the metals without voids being generated, thereby decreasing the equivalent resistance of formed semiconductor component with the improved structure of the formed semiconductor component. For instance, the barrier-wetting layer 170 maybe formed in-situ. In this embodiment, the barrier-wetting layer 170 is a titanium nitride/titanium layer (the bottom layer is a titanium nitride layer and the top layer is a titanium layer), wherein the forming method may include the following steps. Nitrogen gas is imported while titanium is sputtered to form the titanium nitride layer, and then stops the supply of the nitrogen gas while titanium is sputtered to form the titanium layer. As shown in FIG. 6, the structure of the titanium nitride/titanium layer 180 formed in-situ includes a titanium nitride layer 182, a titanium layer 184 and a transition layer 186 between the titanium nitride layer 182 and the titanium layer 184, wherein the titanium nitride layer 182 has the properties of a barrier layer while the titanium layer 184 has wetting properties, but it is not limited thereto. The barrier-wetting layer 170 of the present invention formed in-situ can reduce the total thickness of a barrier layer and a wetting layer compared to forming a barrier layer and a wetting layer individually in current semiconductor processes.

In another way, the barrier-wetting layer 170 maybe a titanium/titanium nitride/titanium layer (the bottom layer is a titanium layer, the middle layer is a titanium nitride layer and the top layer is a titanium layer), wherein the forming method may include the following steps. The titanium layer is formed; a nitridation process such as a nitrogen gas importing process or treatment is performed to form the titanium nitride layer by transforming the top surface of the titanium layer; and then, the titanium layer is in-situ formed on the titanium nitride layer, but it is not limited thereto.

Figure 7:
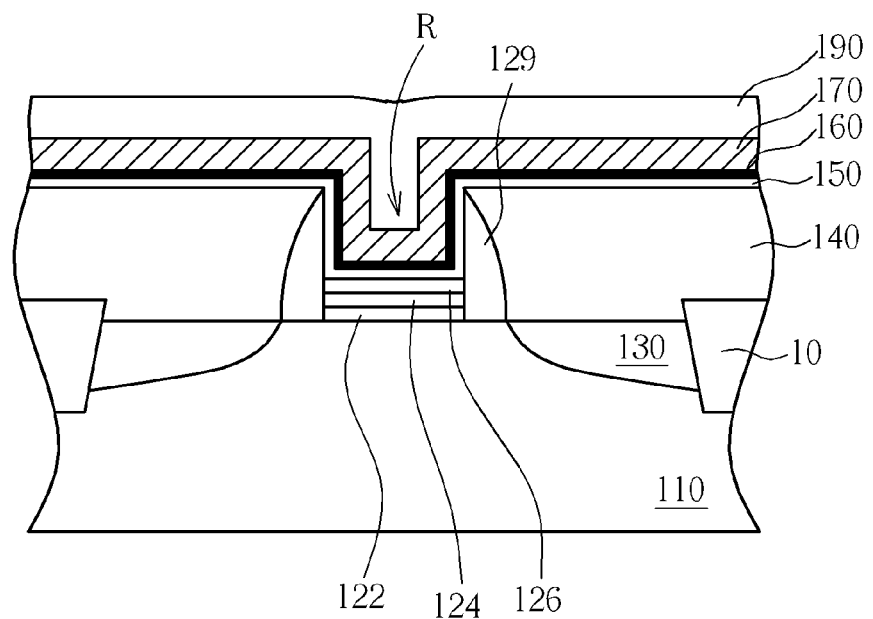
Figure 8:
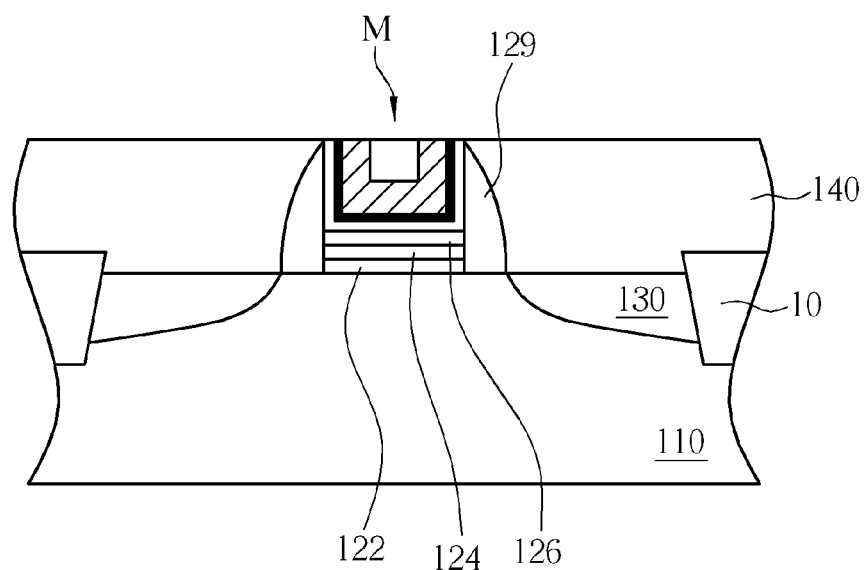

As shown in FIG. 7, a main electrode 190 is formed on the barrier-wetting layer 170, and fills the recess R. In this embodiment, the main electrode 190 is composed of aluminum. In another embodiment, the main electrode 190 may be low resistance materials composed of tungsten, titanium aluminum (TiAl) alloy, cobalt tungsten phosphide (CoWP) or etc. Then, the main electrode 190, the barrier-wetting layer 170, the metal oxide layer 160 and the work function metal layer 150 are planarized, meaning that a metal gate M is now formed as shown in FIG. 8.

It is emphasized that the metal oxide layer 160 is formed on the work function metal layer 150 so as to prevent metals formed above the metal oxide layer 160 such as the main electrode 190 from diffusing downward to the work function metal layer 150, thereby reducing the leakage current density (Jg). More precisely, the metal oxide layer 160 of the present invention is obtained by oxidizing the work function metal layer 150, so that there are no other layers formed on the work function metal layer 150 that occupies some spaces for the barrier-wetting layer 170 and the main electrode 190 formed therein. Moreover, since the metal oxide layer 160, that can prevent metals formed above the metal oxide layer 160 such as the main electrode 190 from diffusing downward, is formed, the thickness of the work function metal layer 150 can be reduced. For example, as the work function metal layer 150 is a titanium aluminum layer and the metal oxide layer 160 is a titanium aluminum oxide layer, the thickness of the titanium aluminum layer can be reduced from 100 angstroms to 30 angstroms and the desired leakage current density (Jg) can still be achieved. Furthermore, as the method of forming the metal oxide layer 160 is paired with the method of forming the barrier-wetting layer 170, the thickness of the barrier-wetting layer 170 can be reduced thanks to the metal oxide layer 160 having already prevented metals from diffusing downward. Thus, the present invention can prevent metals such as the main electrode 190 from diffusing downward and can increase the space where the metals are filled into, so that the difficulties in filling recesses can be avoided. Furthermore, due to the increase of the volume of the metals and the increase of the contact area between the metals such as aluminum and a contact plug (not shown) formed thereon, the contact plug (not shown) can therefore be distanced away from the barrier-wetting layer 170, thereby further decreasing the contact resistance. Specifically, compared to current semiconductor processes that form a barrier layer with a thickness of 40 angstroms and then form a wetting layer with a thickness of 120 angstroms ex-situ, the present invention can provide the barrier-wetting layer 170 with a thickness of 90 angstroms to achieve the same purpose, wherein the titanium nitride layer 182 has a thickness of 40 angstroms and the titanium layer 184 has a thickness of 50 angstroms, and the transition layer 186 is self-reacted and formed by both of them.

Figure 9:
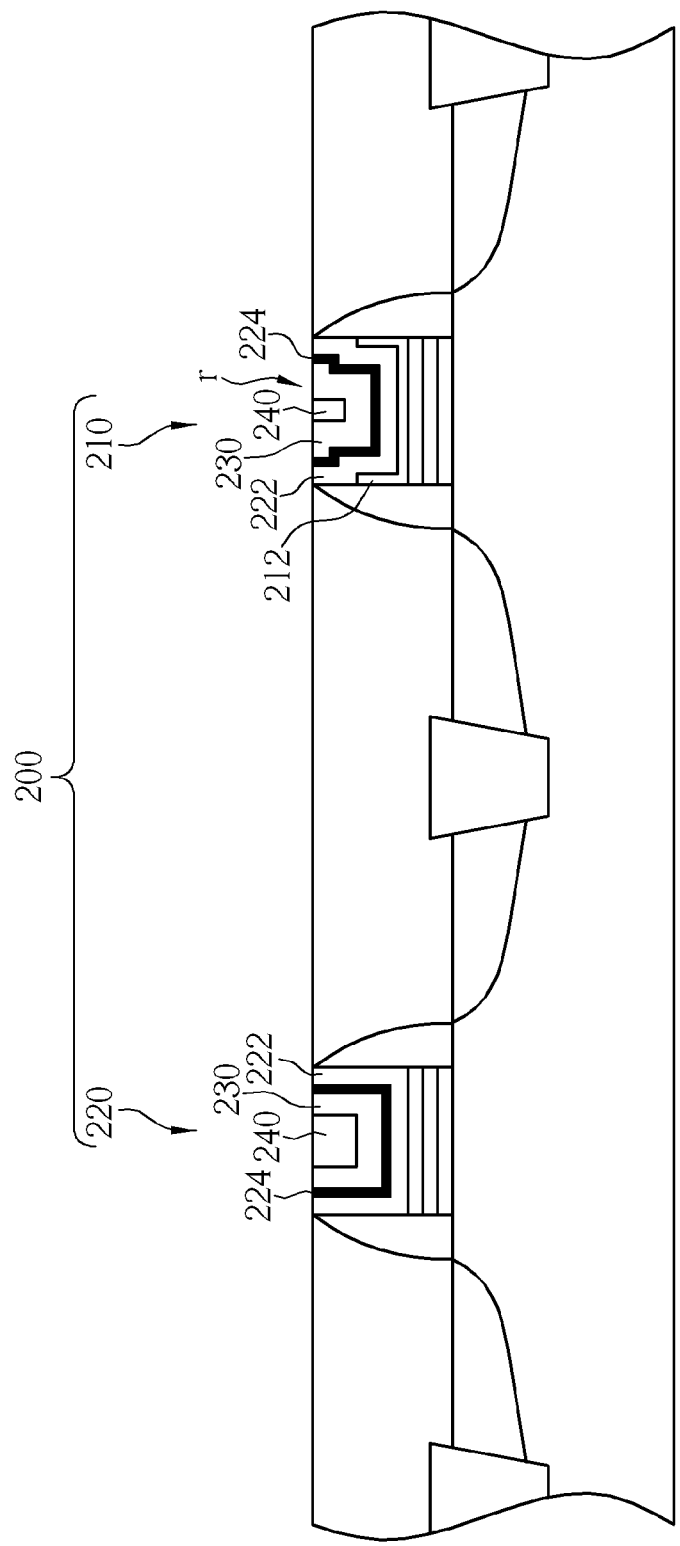
FIG. 9 schematically depicts a cross-sectional view of a CMOS transistor according to an embodiment of the present invention.

Because of said advantages, the present invention plays a more important role when applied to a CMOS transistor. FIG. 9 schematically depicts a cross-sectional view of a CMOS transistor according to an embodiment of the present invention. A CMOS transistor 200 includes a PMOS transistor 210 and an NMOS transistor 220. During processes being performed, a work function metal layer 212 suited for being used in a PMOS transistor such as a titanium nitride layer is formed in the PMOS transistor 210, and then a work function metal layer 222 suited for being used in an NMOS transistor such as a titanium aluminide layer is formed in the PMOS transistor 210 and the NMOS transistor 220. As a result, there is little space remaining in a recess r of the PMOS transistor 210 due to the presence of the work function metal layer 212 and 222 in the PMOS transistor 210. However, the semiconductor process of the present invention can solve said problem. As shown in FIG. 9, a metal oxide layer 224 is formed on the work function metal layer 222 by applying the semiconductor process of the present invention. Then, a barrier-wetting layer 230 is formed on the metal oxide layer 224. A main electrode 240 is then filled into the recess r. The CMOS transistor process is known in the art and the way of the semiconductor process applied to the CMOS transistor 200 is similar to the way of being applied to a single MOS transistor, and will therefore not be described herein.

In another way, the method of forming the metal oxide layer 160/224 on the work function metal layer 150/222 and forming the barrier-wetting layer 170/230 can be adjusted during the processes so as to adjust the thicknesses of the metal oxide layer 160/224 and the barrier-wetting layer 170/230, so that the work function value of formed metal gate M can be adjusted accordingly. Thus, the performances of formed semiconductor component can be improved.

To summarize, the present invention provides a semiconductor structure and a process thereof, which forms a metal oxide layer on a work function metal layer and then forms a barrier-wetting layer on the metal oxide layer. This way, the metal oxide layer of the present invention can prevent metals, such as the main electrode, from diffusing downward to the work function metal layer, thereby reducing a leakage current density (Jg). Moreover, as the metal oxide layer is paired with the barrier-wetting layer, not only metals above the barrier-wetting layer can be prevented from diffusing downward, but also the space where the metals are filled into increases. Thus, difficulties in filling recesses, a reduction of contact resistance between a contact plug (not shown) and aluminum, and fine tuning of the work function value of the metal gate can be improved, thereby enhancing the performances of formed semiconductor components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
 a work function metal layer located on a substrate, the work function metal layer comprising titanium aluminide, regardless of whether the semiconductor structure is a PMOS transistor or a NMOS transistor;
 a work function metal oxide layer located on the work function metal layer;
 a main electrode located on the work function metal oxide layer; and
 a barrier-wetting layer located between the work function metal oxide layer and the main electrode, so that the work function metal layer, the work function metal oxide layer, the barrier-wetting layer and the main electrode constitute a metal gate.

2. The semiconductor structure according to claim 1, wherein the work function metal oxide layer comprises an aluminum titanium oxide layer.

3. The semiconductor structure according to claim 1, wherein the main electrode comprises aluminum.

4. The semiconductor structure according to claim 1, wherein the barrier-wetting layer comprises a titanium nitride/titanium layer.

5. The semiconductor structure according to claim 4, wherein a top layer is the titanium layer and a bottom layer is the titanium nitride layer.

6. The semiconductor structure according to claim 1, wherein the barrier-wetting layer comprises a titanium/titanium nitride/titanium layer.

7. A semiconductor structure, comprising:
 a work function metal layer located on a substrate, the work function metal layer comprising titanium aluminide, regardless of whether the semiconductor structure is a PMOS transistor or a NMOS transistor;

a metal oxide layer located on the work function metal layer;

a main electrode located on the metal oxide layer; and a barrier-wetting layer located between the metal oxide layer and the main electrode, so that the work function metal layer, the metal oxide layer, the barrier-wetting layer and the main electrode constitute a metal gate.

8. The semiconductor structure according to claim 7, wherein the metal oxide layer comprises an aluminum titanium oxide layer.

9. The semiconductor structure according to claim 7, wherein the main electrode comprises aluminum.

10. The semiconductor structure according to claim 7, wherein the barrier-wetting layer comprises a titanium nitride/titanium layer.

11. The semiconductor structure according to claim 7, wherein the barrier-wetting layer comprises a titanium/titanium nitride/titanium layer.

12. The semiconductor structure according to claim 10, wherein a top layer is the titanium layer and a bottom layer is the titanium nitride layer.

* * * * *